(12) United States Patent
Cartic et al.

(10) Patent No.: US 11,611,408 B2
(45) Date of Patent: Mar. 21, 2023

(54) METHODS, SYSTEMS AND COMPUTER READABLE MEDIA FOR RECONSTRUCTING UNCORRECTABLE FORWARD ERROR CORRECTION (FEC) DATA

(71) Applicant: Keysight Technologies, Inc., Santa Rosa, CA (US)

(72) Inventors: Sanjay Cartic, Woodland Hills, CA (US); Gerald Raymond Pepper, Newbury Park, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

(21) Appl. No.: 17/335,889

(22) Filed: Jun. 1, 2021

(65) Prior Publication Data
US 2022/0385396 A1 Dec. 1, 2022

(51) Int. Cl.
*H04L 1/00* (2006.01)
*H03M 13/15* (2006.01)
(52) U.S. Cl.
CPC ...... *H04L 1/0042* (2013.01); *H03M 13/1515* (2013.01); *H04L 1/0047* (2013.01); *H04L 1/0061* (2013.01)
(58) Field of Classification Search
CPC ... H04L 1/0042; H04L 1/0047; H04L 1/0061; H03M 13/1515
See application file for complete search history.

(56) References Cited

U.S. PATENT DOCUMENTS

| | | | |
|---|---|---|---|
| 6,862,701 B2* | 3/2005 | Walker | H04L 1/242 714/715 |
| 2002/0122223 A1* | 9/2002 | Gallant | H04B 10/00 398/33 |
| 2003/0044005 A1 | 3/2003 | Lee et al. | |
| 2012/0237036 A1* | 9/2012 | Dabak | H05K 5/0278 380/287 |
| 2014/0101356 A1* | 4/2014 | Sonoda | G06F 13/4027 710/313 |
| 2014/0281830 A1* | 9/2014 | Cideciyan | H03M 5/145 714/775 |
| 2016/0162357 A1* | 6/2016 | Desireddi | G06F 3/0679 714/764 |
| 2016/0313399 A1* | 10/2016 | Lin | G01R 31/31716 |
| 2017/0257327 A1* | 9/2017 | Krakirian | H04L 49/3063 |
| 2020/0021313 A1* | 1/2020 | Lu | H04L 1/0065 |

FOREIGN PATENT DOCUMENTS

WO 2020083464 A1 4/2020

* cited by examiner

*Primary Examiner* — Thien Nguyen (57) ABSTRACT

A method for reconstructing uncorrectable forward error correction (FEC) data includes generating and transcoding a known bit sequence and transmitting a FEC encoded codeword that includes a payload containing the transcoded known bit sequence through a component under test. The method further includes receiving the FEC encoded codeword transmitted via the component under test and determining that the encoded contents of the FEC encoded codeword contains a number of symbol errors that exceeds a predefined threshold. The method also includes utilizing stored scramble seed bits corresponding to an immediately preceding FEC encoded codeword and the transcoded known bit sequence to generate a reconstructed codeword.

20 Claims, 5 Drawing Sheets

METHODS, SYSTEMS AND COMPUTER READABLE MEDIA FOR RECONSTRUCTING UNCORRECTABLE FORWARD ERROR CORRECTION (FEC) DATA

TECHNICAL FIELD

The subject matter described herein relates to the detection and prediction of uncorrectable forward error correction (FEC) errors. More particularly, the subject matter described herein relates to reconstructing uncorrectable FEC data.

BACKGROUND

The testing of network equipment can include measuring how accurately the equipment can place data on a physical link and send the data to other network equipment over the link. Such measurement is often referred to as a link or component quality measurement, as it measures the quality of the physical link and the components used to transmit and receive data over the link. Examples of link components for which it may be desirable to evaluate quality include serializer/deserializers (SerDes), retimers, or other components used to place bits on a link or receive bits from a link.

One way in which link or component quality is measured is by counting the number of symbol or bit errors that occur over a given amount of time or per quantity of received data. If no error correcting codes are used on a link, measuring link or component quality based on bit errors is a relatively simple task. The sending network equipment sends data over the link, and the receiving network equipment counts the number of bit errors in the received data as a measurement of link or component quality.

Error correcting codes, and in particular, forward error correcting codes, are used by transmitting and receiving network equipment to correct bit errors before and/or while the received data is processed by the receiving network equipment. In some FEC codes, parity symbols or checksum symbols (e.g., checksums) are inserted in transmitted data, and the receiving network equipment uses the parity symbols to identify and correct symbol errors in the received data, where each symbol is a specified number of bits. FEC has become essential in high speed networks, such as 100 gigabit Ethernet networks, to reduce the effects of symbol or bit errors on transmitted data and to decrease the cost of transmitting and receiving network equipment. For example, if FEC can correct bit errors in received data, lower-cost components can be used to transmit and receive the data, since the transmission and reception of the data do not need to be completely free of bit errors.

FEC decoders, such as Reed-Solomon FEC decoders, correct bit errors by correcting symbols. Collections of symbols are referred to as codewords or blocks. A FEC decoder can correct codewords as long as the number of symbol errors does not exceed a fixed number of codeword errors in the symbol. When the number of codeword errors exceeds the threshold, the codeword is designated as being uncorrectable, as it cannot be corrected by the FEC decoder at the receiver. Uncorrectable codeword errors are undesirable because the underlying data is lost.

In light of these difficulties, there exists a need for improved methods, systems, and computer readable media for reconstructing uncorrectable FEC data.

SUMMARY

A method for reconstructing uncorrectable forward error correction (FEC) data is disclosed. The method includes generating and transcoding a known bit sequence and transmitting a FEC encoded codeword that includes a payload containing the transcoded known bit sequence through a component under test. The method further includes receiving the FEC encoded codeword transmitted via the component under test and determining that the encoded contents of the FEC encoded codeword contains a number of symbol errors that exceeds a predefined threshold. The method also includes utilizing stored scramble seed bits corresponding to an immediately preceding FEC encoded codeword and the transcoded known bit sequence to generate a reconstructed codeword.

In some embodiments of the method, the bit sequence comprises a known pseudo-random bit sequence.

In some embodiments of the method, transmitting the bit sequence through a component under test comprises transmitting the bit sequence over an Ethernet link.

In some embodiments of the method, the stored scramble seed bits and a transcoded data bit are applied to a polynomial associated with a FEC decoder to produce a scrambled bit of the reconstructed codeword.

In some embodiments of the method, the FEC decoder is a Reed-Solomon error correcting code.

In some embodiments of the method, the reconstructed codeword displays the location of symbol errors using lanes marked on a related uncorrectable codeword.

In some embodiments of the method, the reconstructed codeword is utilized to predict locations of symbol errors in the known bit sequence.

A system for reconstructing uncorrectable forward error correction (FEC) data is also disclosed. The system includes a codeword generator configured for generating and transcoding a known bit sequence and transmitting a FEC encoded codeword that includes a payload containing the transcoded known bit sequence through a component under test. The system further includes a codeword analyzer configured for receiving the FEC encoded codeword transmitted via the component under test and determining that the encoded contents of the FEC encoded codeword contains a number of symbol errors that exceeds a predefined threshold. The system further includes a codeword reconstruction engine for utilizing stored scramble seed bits corresponding to an immediately preceding FEC encoded codeword and the transcoded known bit sequence to generate a reconstructed codeword.

In some embodiments of the system, the bit sequence comprises a known pseudo-random bit sequence.

In some embodiments of the system, the codeword generator is further configured for transmitting the bit sequence over an Ethernet link.

In some embodiments of the system, the stored scramble seed bits and a transcoded data bit are applied to a polynomial associated with a FEC decoder to produce a scrambled bit of the reconstructed codeword.

In some embodiments of the system, the FEC decoder is a Reed-Solomon error correcting code.

In some embodiments of the system, the reconstructed codeword displays the location of symbol errors using lanes marked on a related uncorrectable codeword.

In some embodiments of the system, the reconstructed codeword is utilized to predict locations of symbol errors in the known bit sequence.

The subject matter described herein for reconstructing uncorrectable FEC data may be implemented in hardware, software, firmware, or any combination thereof. As such, the terms "function" or "module" as used herein refer to hardware, software, and/or firmware for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

The subject matter described herein will now be explained with reference to the accompanying drawings, wherein like reference numerals represent like parts, of which.

DETAILED DESCRIPTION

Figure 1:
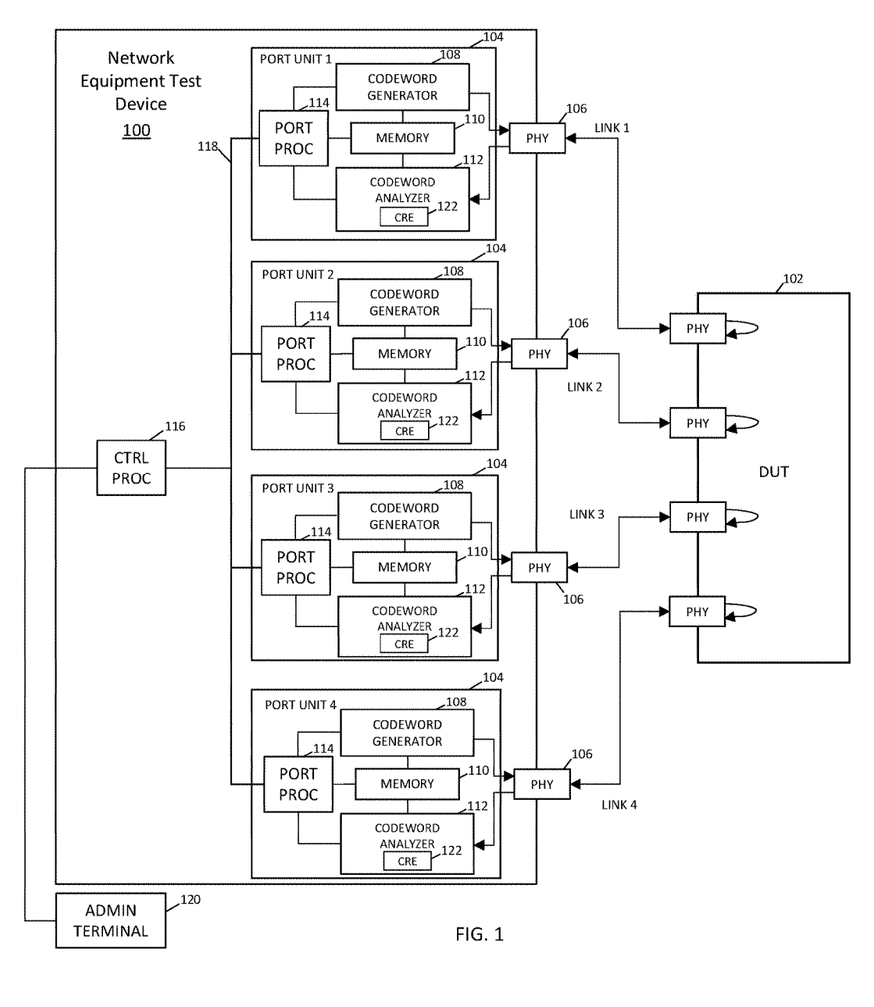
FIG. 1 is a block diagram of an exemplary test device for reconstructing uncorrectable FEC codewords according to an embodiment of the subject matter described herein.

The subject matter described herein includes methods, systems, and computer readable media for reconstructing uncorrectable FEC data. FIG. 1 is a block diagram of an exemplary system for detecting and remedying uncorrectable FEC errors. Referring to FIG. 1, the system includes a network equipment test device 100 configured to generate test frame (e.g., an idle packet/frame, a data packet/frame, or any other like packet/frame) and transmit the test frames to a device under test 102. Device under test 102 may be any suitable network device that includes networking capabilities. For example, device under test 102 may be a router, a switch, a firewall, a network address translator, or similar network component.

In the illustrated example, network equipment test device 100 includes a plurality of port units 104 that transmit test frames (e.g., idle packets and/or frames) to device under test 102 and receive frames from device under test 102 via physical layer chips 106. Each physical layer chip 106 includes a transmitter for transmitting bit sequences (i.e., in encoded block and/or codeword format) to DUT 102 and a receiver for receiving bit sequences (i.e., in encoded block and/or codeword format) from DUT 102. In one example, each physical layer chip 106 may be implemented using an Ethernet transceiver and the links or components being evaluated for quality include the Ethernet links or components in each physical layer chip 106 that transmit and receive bits over each Ethernet link. As stated above, examples of such components includes serializer/deserializers, retimers, and other hardware used to transmit and receive encoded blocks or codewords. As described herein, a codeword comprises a block of scrambled data (e.g., bits or symbols) and an appended checksum symbol (e.g., 30 bit checksum symbol). In some embodiments, the codeword comprise a FEC In some embodiments, each port unit 104 may be implemented as all or part of a printed circuit board mounted in a chassis. In the illustrated example, each port unit 104 includes a bit sequence generator, which in the illustrated example is a codeword generator 108 (which includes a pseudo-random bit sequence (PRBS) generator), memory 110, a codeword analyzer 112, and a port processor 114. Codeword generator 108 of each port unit initially generates pseudo-random bit sequences (e.g., test payloads), which are subsequently organized into blocks and/or codewords to be transmitted to device under test 102. Physical layer chips 106 package the block payloads into frames, transmit the frames to device under test 102, receive frames from device under test 102, and unpackage (e.g., unscramble) the blocks from the received frames in a manner described below.

Memory 110 stores test configuration information and test results. Port processor 114 controls the overall operation of each port unit 104. In addition, each port processor 114 may communicate with a control processor 116 over a backplane 118. Control processor 116 may control the overall operation of network equipment test device 100. Control processor 116 may also control communications between admin terminal 120 and port processors 114. Admin terminal 120 may be a computing device through which a test system operator configures network equipment test device 100 and views output generated by network equipment test device 100.

In some embodiments, physical layer chips 106 of device under test 102 can be configured in loopback mode to loop frames received from test device 100 back over the link over which the packets and/or frames are received. The physical layer chips 106 receive the looped back frames and provide the bit sequences extracted from the frames to a codeword analyzer 112. Codeword analyzer 112 is configured for receiving ingress block and/or codewords and determines whether the same contain an acceptable or unacceptable number of FEC errors (described in greater detail below).

The subject matter described herein is not limited to the test setup illustrated in FIG. 1 to reconstructing uncorrectable FEC data. Any suitable test setup where a block/codeword is transmitted over a link or through a component under test and/or a block/codeword is received from the link or component under test is intended to be within the scope of the subject matter described herein. For example, in FIG. 1, transmit side components of each physical layer chip 106 in network equipment test device 100 or in a network device that is not a network equipment test device, such as a switch, a router, or a network card, may be configured to loop a bit sequence back to receive side components of the physical layer chip 106. Codeword analyzers 112 may further include a codeword reconstruction engine (CRE) 122 that is configured to detect the presence of uncorrectable FEC data in an ingress block/codeword and subsequently reconstruct the encoded block/codeword as described herein. In some embodiments, codeword reconstruction engine 122 may be embodied as an algorithm running on a chip-based hardware component or as a software component executed by a central processing unit.

In some embodiments, codeword analyzer 112 includes a codeword checker (not shown) that initially receives the ingress blocks/codewords from links or components whose quality is being evaluated. The codeword checker may also be configured to output the locations of bit and/or symbol errors in the bit sequence of the received codeword.

In some embodiments, codeword analyzer 112 may determine whether a FEC codeword is uncorrectable by counting the number of symbol errors in the ingress block/codeword and determining whether the number of symbol errors exceeds the uncorrectable threshold for the FEC algorithm being utilized. Codeword analyzer 112 may be configurable with predefined thresholds for the number of symbol errors that will result in a codeword being counted as uncorrectable. In Reed-Solomon encoding/decoding, a codeword is divided into N total symbols. The N total symbols include K data symbols of S bits each and N−K checksum symbols of S bits each. Notably, a Reed-Solomon decoder (e.g., a Reed-Solomon error correcting code) can correct up to a total of "T" symbol errors, where T=(N−K)/2. A symbol error is defined as a symbol with one or more bit errors. Reed-Solomon encoding can correct a symbol if it has only one bit error or up to the symbol size of bit errors. For example, a RS(514, 544) decoder with 10 bit symbols (e.g., symbol size "S"=10 bits) means that each codeword contains 544 total codeword symbols of which 514 symbols are data and 30 symbols are checksum symbols. As used herein as an example, a RS(514, 544) FEC encoder (on the transmission port/side) and corresponding decoder (on the receiver port/side) with the following parameters is used:

N=544, K=514, S=10 bits
2T=30, T=15

This means that the decoder can detect up to 15 symbol errors ("T") before the codeword will be determined to be uncorrectable. Accordingly, codeword analyzer 112 may be configured with the N, K, S, and T parameters for each FEC code against which the link and/or DUT is being evaluated to determine the number of uncorrectable errors.

For example, codeword analyzer 112 may count the number of symbol errors in each codeword and generate corresponding output. In one example, codeword analyzer 112 may compare the number of symbol errors in each codeword to the number of symbol errors that would result in an uncorrectable codeword error for each FEC algorithm against which link or component quality is being evaluated. Codeword analyzer 112 may count and output the number of symbol errors per codeword, the number of uncorrectable codewords, or other measure of link or component quality.

Figure 2:
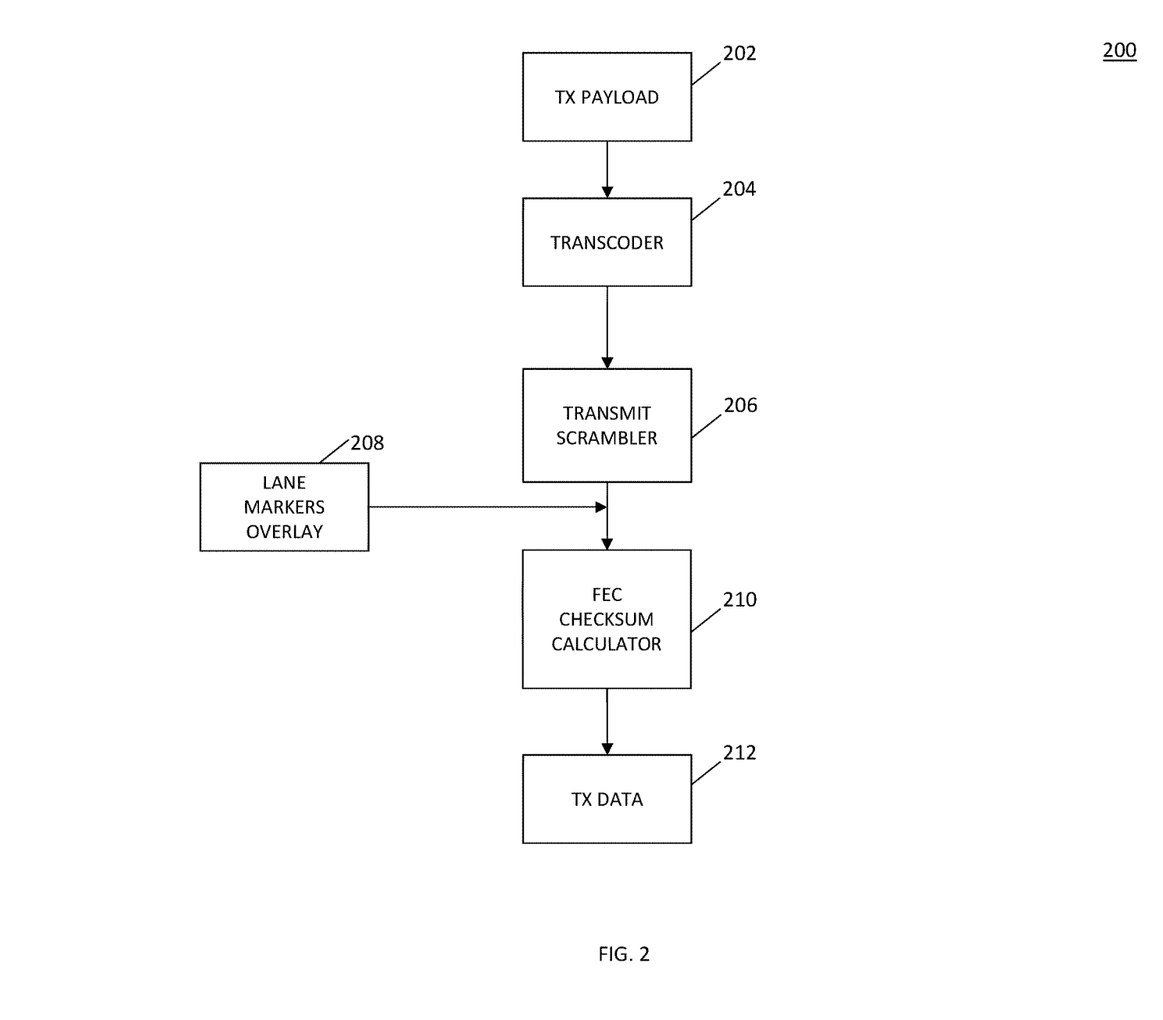
FIG. 2 is a flow diagram of a test device transmission path according to an embodiment of the subject matter described herein.

FIG. 2 illustrates a flow diagram of the operating process 200 of codeword generator 108 (as shown in FIG. 1). In some embodiments, codeword generator 108 may include, or be a part of, a transmitter component of the test device. In some embodiments, process 200 is conducted over a transmit path (e.g., 400GE transmit path) within port unit 104. For example, process 200 is initiated when codeword generator 108 generates a raw bitstream input that is to be sent as a transmission payload (see step 202). Notably, the raw bitstream can be a PRBS stream that is generated by a deterministic algorithm associated with codeword generator 108 and subsequently divided into symbol blocks. For example, the transmission payload can be segmented into blocks of 544 data symbols (wherein each data symbol is 10 bits long).

In step 204, the raw bitstream are transcoded into blocks or codewords. For example, codeword generator 108 can process 544 data symbols of the raw bitstream input and compress them to 514 (transcoded) data symbols.

Once transcoding step 204 is executed, codeword generator 108 conducts a scrambling process by applying a transmit scrambler to the payload data (see step 206). Notably, the transcoded block payload is scrambled such that a scrambled block payload is produced. The transcoded block payload data produced from step 204 may be scrambled using a predefined polynomial associated with the transmit scrambler. In some embodiments, the transmit scrambler can be a multiplicative scrambler or any other scrambler depending on the scrambling mechanism utilized. For example, the predefined polynomial may be a $x^{58}+x^{39}+1$ transmit scrambler. Moreover, the transmit scrambler calculates a new bit (i.e., a "scrambled bit") based on i) the previous 58 bits and ii) the input bit. The 58 bits are called the "scrambler seed" or "seed bits" for the scrambled output being calculated. Specifically, the transmit scrambler calculates each new scrambled bit by using the preceding 58 bits and the "transcoded" input bit being processed (e.g., using the polynomial). More specifically, the transmit scrambler uses the polynomial to generate the scrambled payload using an algorithm where each bit of the scrambled payload is created using the previous 58 bits of the scrambled payload and the input bit. The initial value used before any payload processing is the scrambler seed. Although the following disclosure describes the use of 58 seed bits, any number of seed bits (e.g., largely dependent on the Reed-Solomon FEC coder utilized) can be used by the transmit scrambler without departing from the scope of the disclosed subject matter.

Afterwards, lane marker information is added or appended to the scrambled codeword as indicated in step 208. In particular, the scrambled block data produced from step 206 is subsequently overlaid with FEC lane markers so the receiver port can later identify and/or "lock onto" the boundaries of FEC block and/or codeword. For example, in Ethernet transmissions, data can be divided into electrical lanes, which are multiplexed onto a different number of optical lanes and transmitted over a link. For example, 100 gigabit Ethernet consists of ten 10 Gb/s electrical lanes. 40 gigabit Ethernet consists of four 10 Gb/s electrical lanes. 25 Gb/s Ethernet consists of a single 25 Gb/s electrical lane. The number of bits per lane per time period is referred as the lane width and can be used to establish the aforementioned lane markers.

In step 210 of process 200, codeword generator 108 utilizes an FEC checksum calculator to compute appropriate checksum information for the received scrambled block output. In some embodiments, the transmit FEC checksum calculator calculates a 30 symbol checksum for every 514-symbol block of the scrambled block data output.

After the checksum information is calculated, codeword generator 108 can be configured to append the checksum information to the end of the scrambled block data output to produce an output codeword. In particular, along with the calculated symbol checksum, the output codeword (i.e., FEC encoded egress codeword) is 544 symbols long.

After the checksum information is combined with the scrambled block output, codeword generator 108 is configured to transmit the resulting codeword to the device under test as a digital codeword (see step 212). Notably, the resulting FEC encoded egress codeword is transmitted to a device under test (e.g., DUT 102 in FIG. 1) and subsequently forwarded to a receiving port in the test device.

Figure 3:
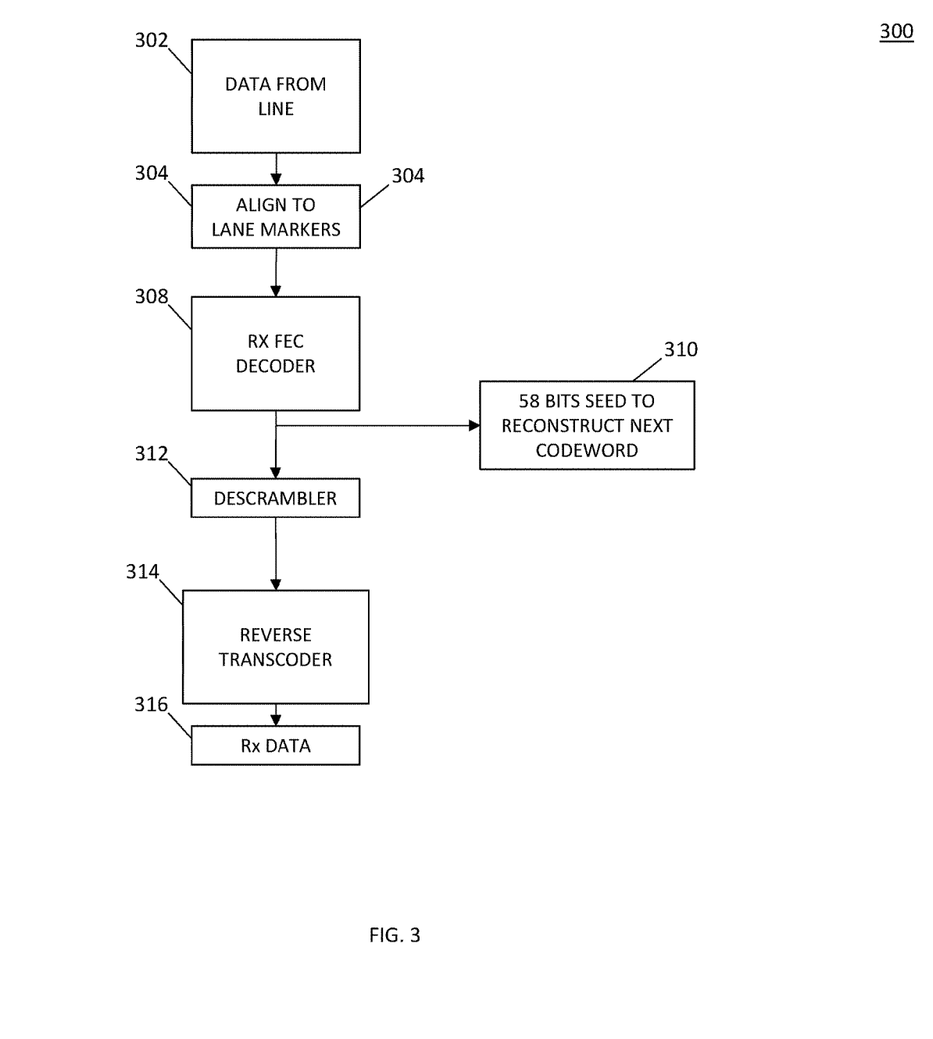
FIG. 3 is a diagram of a test device receiver path according to an embodiment of the subject matter described herein.

FIG. 3 illustrates a flow diagram of an example operating process 300 of codeword analyzer 112. In step 302, codeword analyzer 112 receives a scrambled digital codeword (e.g., FEC encoded egress codeword of 544 symbols) from device under test 102 (as shown in FIG. 1). In step 304, codeword analyzer 112 may be configured to align the symbols in the received codeword in accordance with the lane markers previously established by codeword generator 108 (e.g., see step 208 in FIG. 2). Notably, the boundaries of the encoded codeword are known at this point of process 300. In step 308, codeword analyzer 112 may process the scrambled codeword utilizing a receiver FEC decoder element (e.g., conduct an FEC correction process using the appended checksum information). In some embodiments, the FEC decoder element can be a Reed-Solomon FEC algorithm. For example, the Reed-Solomon FEC algorithm can be a RS(514, 544) decoder that is configured to decode codewords or blocks that are passed through.

In some embodiments, the FEC decoder of codeword analyzer 112 counts the number of FEC symbols with one or more bit errors. If the number of symbols with one or more bit errors is less than or equal to 15, then the FEC codeword may be marked as correctable. If the number of FEC symbols with one more bit errors is greater than 15, codeword analyzer 112 may indicate that the codeword is uncorrectable.

Notably, this exemplary FEC decoder algorithm is configured to correct up to 15 symbol errors. In the event that the number of symbol errors is 15 or less, codeword analyzer 112 and/or FEC decoder is configured to produce an error corrected codeword that can be processed normally by codeword analyzer 112 (i.e., advance along the "normal" receiver FEC data path including descrambler step 312 and reverse transcoding step 314). Prior to any further processing, codeword analyzer 112 copies and designates the last 58 bits of the currently processed codeword as a "bit scrambler seed" in step 310. Notably, the 58 bit scrambler seed is stored should a subsequent codeword be deemed to contain uncorrectable data (as described in detail below).

Returning to the normal FEC data path processing, codeword analyzer 112 is configured to descramble the error corrected data output from the FEC decoder, such that the codeword payload data can be determined (e.g., step 312). Moreover, the descrambled data can then be forwarded to a reverse transcoder element in codeword analyzer 112 that is configured to de-transcode (e.g., see step 314) the unscrambled codeword, which produces the raw original bitstream data (e.g., FEC decoded ingress bits). The raw original bitstream data is then received and appropriately processed by the test device (see step 316).

Notably, the normal receiving FEC receiving data path cannot be executed in the event the codeword is designated as uncorrectable by the codeword analyzer 112 after processing by the FEC decoder in step 308. More specifically, the ideal test scenario involves the device under test (or interposed link) introducing less than 16 symbol errors in the transmitted codeword, thereby enabling the FEC decoder of codeword analyzer (or a separate receiver port) to faithfully regenerate the original bits that were transmitted by codeword generator 108 (or a separate transmission port) and display the original bits to a test system operator. For example, a reconstructed codeword can be used display the location of symbol errors using lanes marked on a related uncorrectable codeword.

However, if the FEC decoder algorithm determines that there are 16 or more symbol errors present in the decoded codeword, codeword analyzer 112 is triggered to execute a reconstruction process (e.g., codeword reconstruction engine 122 in FIG. 1) that is initiated by obtaining a 58 bit scrambler seed segment of a previously processed codeword. Specifically, in the event that there are more than 15 symbol errors within the one received codeword, the receiving FEC decoder is not able to determine the true value of the block or codeword. In such cases, the receiving FEC decoder can only determine that the received block is corrupted (e.g., uncorrectable) as well as notify a test system user of this determination. In some embodiments, the codeword analyzer 112 is triggered to execute a reconstruction process based on any predefined conditions established by the operator (e.g., predefined threshold of uncorrectable symbol errors, specific lane position of uncorrectable symbol errors, specific number of lanes containing uncorrectable symbol errors, or any other like dynamic criteria established by user). The aforementioned reconstruction process is described in FIG. 4 in greater detail.

Figure 4:
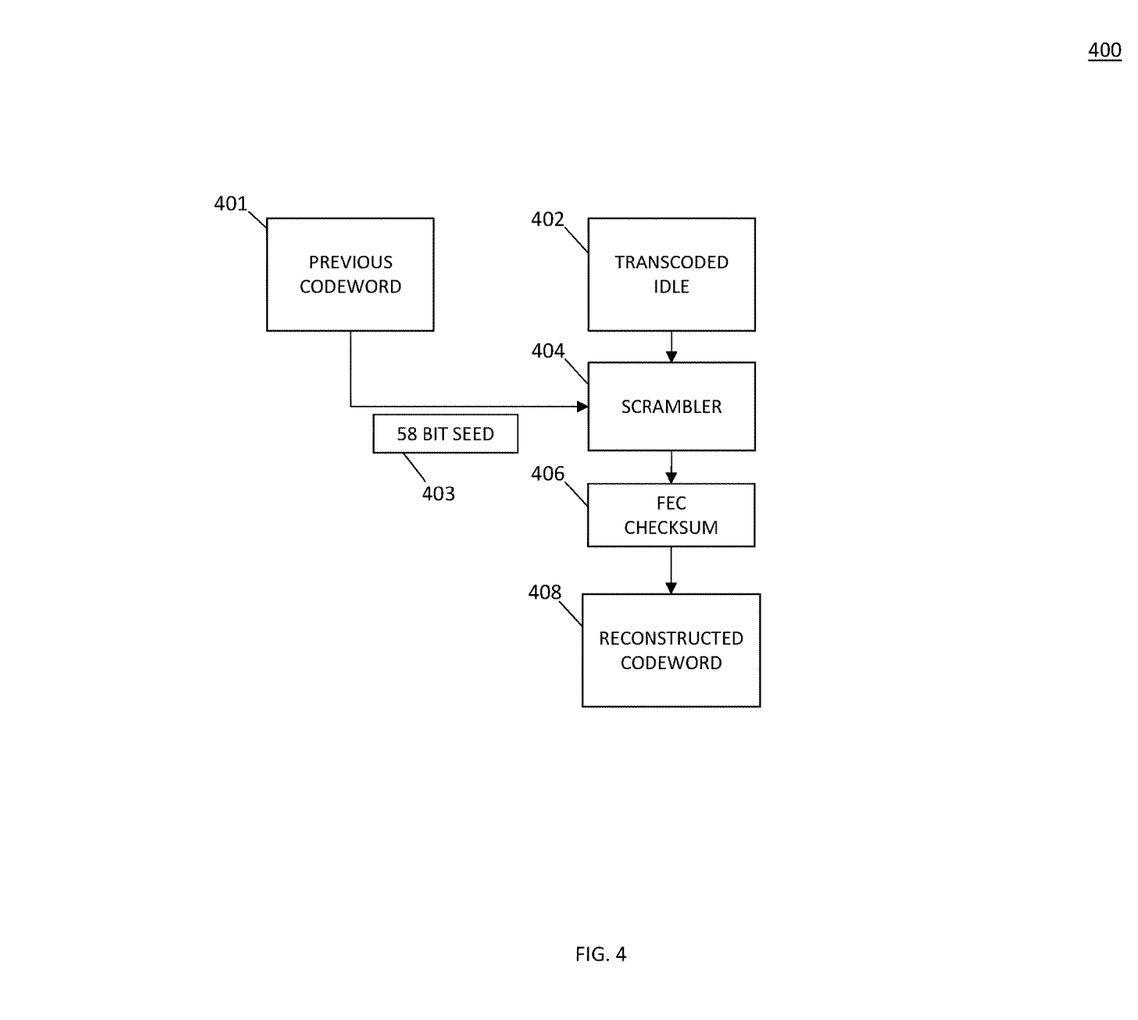
FIG. 4 is a diagram illustrating an exemplary uncorrectable codewode reconstruction path executed by a codeword reconstruction engine according to an embodiment of the subject matter described herein.

FIG. 4 illustrates a flow diagram of the reconstruction process 400 executed by codeword reconstruction engine 122 and/or codeword analyzer 112. As indicated above, the receiving FEC decoder in codeword analyzer 112 may be configured to detect that more than 15 symbol errors are contained within the received encode codeword. In the event that 16 or more symbol errors are detected, reconstruction process 400 is triggered. For example, reconstruction process 400 initiates in block 402 where a particular transcoded known idle message payload (or some other known transcoded data payload) is received by codeword reconstruction engine 122 as a block of unscrambled data. In some embodiments, the reconstruction engine can construct the idle payload in the same manner as the transmitter (e.g., steps 202-206 in FIG. 2). Notably, this is possible because the receiver knows what payload (i.e., idle payload) is being transmitted since the transmitter and the receiver are components of the same test system (e.g., the transmitter can be configured to provide the payload information to the receiver). As used herein, the idle message payload is a group of packets that is repetitively transmitted during a period where data is unavailable for transmission. Codeword reconstruction engine 122 further utilizes stored bit seed data 403 associated with the previously processed codeword (which was previously designated as being valid) in step 401 in order to reconstruct a codeword that has been deemed uncorrectable (in process 300 in FIG. 3).

In step 404, the scrambler algorithm receives the 58 bit seed data which is used to generate a scrambler seed. In some embodiments, the scramble seed is the previously processed 58 bits (i.e., at the start of the reconstruction process, the 58 bit seed of the previous correctable codeword is used) is applied to a polynomial algorithm associated with the FEC decoder being utilized. For example, the polynomial algorithm output of the last 58 bits of the previously valid codeword (as previously stored) produces the scrambler seed and the next 5140 bits of the transcoder transmit payload can be reconstructed using the idle message bits as payload data. This block of 514 data symbols (of 10 bits each) is then passed through a FEC checksum calculator (see step 406) to derive the associated 30 checksum symbols. Notably, the reconstructed codeword produced in step 408 is 544 symbols long (i.e., 514 data symbols+30 checksum symbols). Notably, reconstruction process 400 requires at least one previously processed valid/correctable codeword in order to create the necessary scrambler seed. Reconstruction process 400 is described in greater detail below in FIG. 5.

Figure 5:
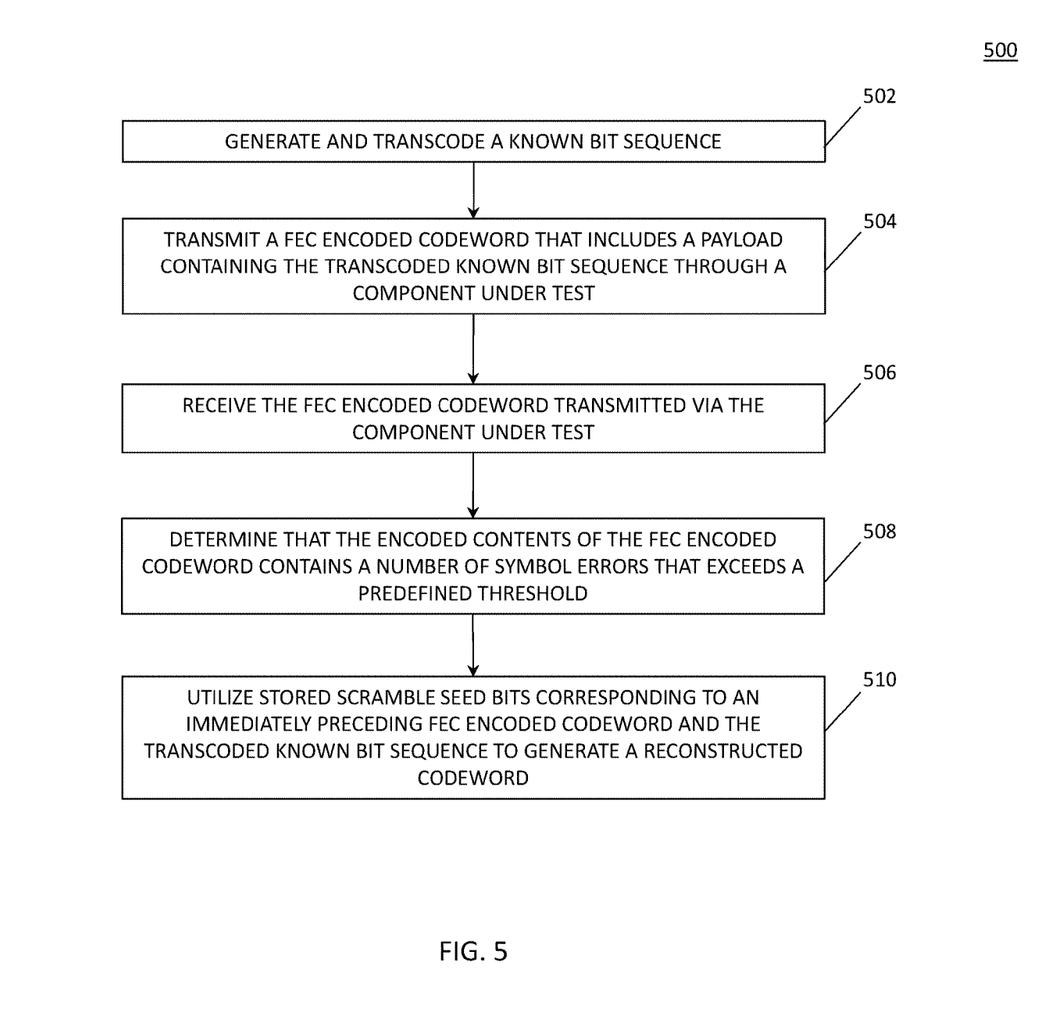
FIG. 5 is a flow chart illustrating an exemplary process for reconstructing uncorrectable FEC data.

FIG. 5 is a flow diagram illustrating an exemplary process 500 for reconstructing uncorrectable FEC data. Referring to FIG. 5, in step 502, a bit sequence is generated. In some embodiments, a test device includes a transmission port that is configured to transcode the generated bit sequence. For example, codeword generator 108 illustrated in FIG. 1 may generate a pseudo-random bit sequence, segment the bit sequence into a block, and convert the block to an encoded codeword (e.g., transcode, scramble, and derive/append checksum) for transmission to a component under test (e.g., a SUT, DUT, or link) to be tested.

In block 504, an egress FEC encoded codeword that includes a payload containing the transcoded bit sequence is transmitted over a link or through a device under test. For example, a codeword payload containing the generated bit sequence is initially transmitted to a device under test, which in turn subsequently forwards the codeword payload to a receiving port of the test device.

In block 506, the FEC encoded codeword transmitted via the DUT (or through a link being tested) is received. In some embodiments, a receiver port of the test system receives the encoded codeword as a series of codewords (or blocks) containing bits of data. For example, the receiver port of the test system may receive a block "N" at time "T".

In block 508, it is determined that the encoded contents of the FEC encoded codeword contains a number of symbol errors that exceeds a predefined threshold. For example, the codeword reconstruction engine in the codeword analyzer may determine that the codeword contains more than 15 symbol errors. Notably, the number of symbol errors exceeds a predefined value thereby rendering the codeword to be designated as uncorrectable. In particular, the true value of the associated codeword cannot be determined. In contrast, if the number of symbol errors does not exceed the threshold, the codeword may be identified as correctable and the receiving operation of the codeword analyzer proceeds normally.

In block 510, stored scramble seed bits corresponding to an immediately preceding FEC encoded codeword and the transcoded known bit sequence are utilized to generate a reconstructed codeword. At this stage, the codeword reconstruction engine is further configured to determine the transcoded value of an idle payload. In some embodiments, stored scrambler seed bits corresponding to an immediately preceding FEC encoded codeword (e.g., codeword "N−1" received at time "T−1") and the transcoded known bit sequence are utilized to establish a scramble bit. In some embodiments, the codeword reconstruction engine is configured to retrieve the previously stored 58 bit seed (e.g., stored scramble seed) associated with codeword N−1. Utilizing the 58 bit scramble seed and the scrambler polynomial, the codeword reconstruction engine is configured to generate a (first) scramble bit.

In one example scenario, the codeword reconstruction engine is configured to scramble the idle payload using the 58 bit seed (e.g., stored scramble seed). In particular, the codeword reconstruction engine utilizes the 58 bit seed from codeword N−1 along with the transcoded value (e.g., a first transcoded bit) of the idle payload to compute a predicted value for the scrambled block N (i.e., the predicted and/or reconstructed block). The codeword reconstruction engine is further configured to compute and append checksum information to the reconstructed block N to form a reconstructed codeword N. Notably, the reconstructed codeword can be used to predict the locations of all the bit errors contained within in the uncorrectable codeword. In some embodiments, the reconstructed codeword N (i.e., block N with appended checksum information) is presented and or made available to a test system user via a graphical user interface.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for reconstructing uncorrectable forward error correction (FEC) data, the method comprising:
    generating and transcoding a known bit sequence;
    transmitting a FEC encoded codeword that includes a payload containing the transcoded known bit sequence through a component under test;
    receiving the FEC encoded codeword transmitted via the component under test;
    designating the FEC encoded codeword as an uncorrectable codeword in response to determining that encoded contents of the FEC encoded codeword contains a number of symbol errors that exceeds a predefined threshold; and
    utilizing stored scramble seed bits corresponding to an immediately preceding FEC encoded codeword and the transcoded known bit sequence to generate a reconstructed codeword associated with the FEC encoded codeword, wherein the preceding FEC encoded codeword is a codeword that was processed before the FEC encoded codeword.

2. The method of claim 1 wherein the bit sequence comprises a known pseudo-random bit sequence.

3. The method of claim 1 wherein transmitting the bit sequence through a component under test comprises transmitting the bit sequence over an Ethernet link.

4. The method of claim 1 wherein the stored scramble seed bits and a transcoded data bit are applied to a polynomial associated with a FEC decoder to produce a scrambled bit of the reconstructed codeword.

5. The method of claim 4 wherein the FEC decoder is a Reed-Solomon error correcting code.

6. The method of claim 1 wherein the reconstructed codeword displays the location of symbol errors using lanes marked on a related uncorrectable codeword.

7. The method of claim 6 wherein the reconstructed codeword is utilized to predict locations of symbol errors in the known bit sequence.

8. A system for reconstructing uncorrectable forward error correction (FEC) data, the system comprising:
    a codeword generator configured for generating and transcoding a known bit sequence and transmitting a FEC encoded codeword that includes a payload containing the transcoded known bit sequence through a component under test;
    a codeword analyzer configured for receiving the FEC encoded codeword transmitted via the component under test and designating the FEC encoded codeword as an uncorrectable codeword in response to determining that encoded contents of the FEC encoded codeword contains a number of symbol errors that exceeds a predefined threshold; and
    a codeword reconstruction engine for utilizing stored scramble seed bits corresponding to an immediately preceding FEC encoded codeword and the transcoded known bit sequence to generate a reconstructed codeword associated with the FEC encoded codeword, wherein the preceding FEC encoded codeword is a codeword that was processed before the FEC encoded codeword.

9. The system of claim 8 wherein the bit sequence comprises a known pseudo-random bit sequence.

10. The system of claim 8 wherein the codeword generator is further configured for transmitting the bit sequence over an Ethernet link.

11. The system of claim 8 wherein the stored scramble seed bits and a transcoded data bit are applied to a polynomial associated with a FEC decoder to produce a scrambled bit of the reconstructed codeword.

12. The system of claim 11 wherein the FEC decoder is a Reed-Solomon error correcting code.

13. The system of claim 8 wherein the reconstructed codeword displays the location of symbol errors using lanes marked on a related uncorrectable codeword.

14. The system of claim 13 wherein the reconstructed codeword is utilized to predict locations of symbol errors in the known bit sequence.

15. A non-transitory computer readable medium having stored thereon executable instructions that when executed by a processor of a computer control the computer to perform steps comprising:

generating and transcoding a known bit sequence;

transmitting a FEC encoded codeword that includes a payload containing the transcoded known bit sequence through a component under test;

receiving the FEC encoded codeword transmitted via the component under test;

designating the FEC encoded codeword as an uncorrectable codeword in response to determining that encoded contents of the FEC encoded codeword contains a number of symbol errors that exceeds a predefined threshold; and utilizing stored scramble seed bits corresponding to an immediately preceding FEC encoded codeword and the transcoded known bit sequence to generate a reconstructed codeword associated with the FEC encoded codeword, wherein the preceding FEC encoded codeword is a codeword that was processed before the FEC encoded codeword.

16. The non-transitory computer readable medium of claim 15 wherein the bit sequence comprises a known pseudo-random bit sequence.

17. The non-transitory computer readable medium of claim 15 wherein transmitting the bit sequence through a component under test comprises transmitting the bit sequence over an Ethernet link.

18. The non-transitory computer readable medium of claim 15 the stored scramble seed bits and a transcoded data bit are applied to a polynomial associated with a FEC decoder to produce a scrambled bit of the reconstructed codeword.

19. The non-transitory computer readable medium of claim 18 wherein the FEC decoder is a Reed-Solomon error correcting code.

20. The non-transitory computer readable medium of claim 15 wherein the reconstructed codeword displays the location of symbol errors using lanes marked on a related uncorrectable codeword.

* * * * *